(12) United States Patent
Lasbouygues et al.

(10) Patent No.: US 7,487,482 B2
(45) Date of Patent: Feb. 3, 2009

(54) METHOD AND SYSTEM FOR EVALUATING A CONSTRAINT OF A SEQUENTIAL CELL

(75) Inventors: Benoit Lasbouygues, La Tronche (FR); Joël Schindler, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 351 days.

(21) Appl. No.: 11/382,602

(22) Filed: May 10, 2006

(65) Prior Publication Data

US 2006/0259839 A1 Nov. 16, 2006

(30) Foreign Application Priority Data

May 13, 2005 (FR) .................................. 05 04837

(51) Int. Cl.
*G06F 17/50* (2006.01)
(52) U.S. Cl. ............................................. 716/6; 703/19
(58) Field of Classification Search .................. None
See application file for complete search history.

(56) References Cited

U.S. PATENT DOCUMENTS

| | | | | |
|---|---|---|---|---|
| 5,559,715 A | * | 9/1996 | Misheloff ........................ 703/19 |
| 6,311,148 B1 | * | 10/2001 | Krishnamoorthy ............ 703/19 |
| 6,640,330 B1 | * | 10/2003 | Joshi ............................... 716/9 |
| 6,732,066 B2 | * | 5/2004 | Krishnamoorthy ............ 703/14 |
| 2003/0204818 A1 | | 10/2003 | Kashyap .......................... 716/1 |
| 2003/0212972 A1 | | 11/2003 | Tran ................................ 716/6 |
| 2004/0199888 A1 | | 10/2004 | Katla et al. .................... 716/6 |

* cited by examiner

*Primary Examiner*—Leigh Marie Garbowski
(74) *Attorney, Agent, or Firm*—Lisa K. Jorgenson; Allen, Dyer, Doppelt, Milbrath & Gilchrist, P.A.

(57) ABSTRACT

The method evaluates a constraint of a sequential memory cell able to sample an input data item regulated by a clock signal. The constraint is dependent on the ramp of a first signal and on the ramp of a second signal. The method includes a characterization phase including a first step of determination in which a value of the second ramp is fixed, the value of the first ramp is made to vary so as to determine, a first set of values of the constraint. A second step of determination includes the value of the first ramp being fixed at one of its values taken during the first step of determination, the value of the second ramp is made to vary so as to determine for each value of the second ramp a deviation with respect to the value of the constraint belonging to the first set and corresponding to the fixed value of the first ramp. The method includes a third step of calculation in which the values of the constraint are calculated for all the values of the first ramp and of the second ramp, while adding the various deviations obtained to the values of the first set of values.

22 Claims, 8 Drawing Sheets

METHOD AND SYSTEM FOR EVALUATING A CONSTRAINT OF A SEQUENTIAL CELL

FIELD OF THE INVENTION

The present invention relates to integrated circuits, and more particularly to the characterization of constraints, such as the set up time and the hold time for the data, of a sequential memory cell.

BACKGROUND OF THE INVENTION

Each memory cell is characterized by its topology and by a set of constraints, that is to say a set of conditions that the cell must fulfill. These cells and their constraints are contained in a standard characterization library characterization file. The sequential cells relate to only 15% of the total library, but demand a simulation time three times as large as the combinatorial cells which, however, represent 85% of the library, during the determination of the values of constraints relevant to them.

This duration of simulation is all the more consequential as each characterization depends on a so-called "PVT" ("Process, Voltage, Temperature") exterior condition. It is then necessary to determine a constraint value for each exterior condition value. Therefore, it is difficult to characterize a sequential cell by exhaustive simulations, given that some ten hours of simulation are necessary to determine the value of a constraint of a single cell and for just one "PVT" condition.

Additionally, the 90 nm and beyond new technologies used are very sensitive to the value of the ramps of the input signals of the sequential cell, so much so that for two different values of ramp, the value of the constraint will be different. Consequently to have an exact value of the constraint, it is necessary to take account of the value of the ramps of the input signals of the sequential cell, this multiplying even further the number of simulations to be performed. There therefore exists a strong demand to reduce this duration of simulation.

U.S. patent publication No. 2004/0199888 proposes that the number of iterations required for each constraint value be decreased. These simulations are performed with the aid of a dichotomy procedure which includes optimizing an interval inside which the constraint value lies until this interval attains a value small enough for it to be possible to regard its midvalue as the constraint value while making only a tiny error. To limit the number of iterations performed to attain the value of the constraint, the published application presents a procedure making it possible to approximately measure the value of the constraint with the aid of a propagation time chosen, so as to deduce therefrom a simulation interval restricted about this approximate value. Thus, the number of iterations required to attain the value of the constraint is fewer, given that the interval is previously optimized.

However, even if this procedure makes it possible to reduce the number of iterations, it remains very complex and particularly unwieldy to implement. Specifically, to calculate the constraint time, it requires the determination of the propagation lags point by point for each gate of the sequential cell to be characterized. The cell characterization time is obtained thereafter with the aid of a conventional formula, well known to the person skilled in the art. Consequently, this procedure requires very accurate knowledge of the structure of the sequential cell to be characterized.

SUMMARY OF THE INVENTION

An object of the invention is to provide a more satisfactory approach to the problems of the characterization of sequential memory cells.

According to a first aspect of the invention, there is provided a method for evaluating a constraint of a sequential cell able to sample an input data item regulated by a clock signal, the constraint being dependent on the ramp of a first signal and on the ramp of a second signal, these two signals being delivered to the sequential cell and comprising the clock signal. Furthermore, the constraint belongs to the group formed by the setup time and the hold time of the data item.

The sequential cell may for example be a flip-flop with one or more stages. The setup time for the data item represents the minimum duration for which the data must be stable ahead of the active edge of the clock. The hold time for the data item is the minimum time during which the data item present on the input must remain stable after the active edge of the clock for this data item to be recognized.

According to a general characteristic of this aspect of the invention, the method includes a characterization phase comprising: a first step of determination in which a value of the second ramp is fixed, the value of the first ramp is made to vary so as to determine by simulation using a model of the cell, a first set of values of the constraint; a second step of determination in which the value of the first ramp is fixed at one of its values taken during the first step of determination, the value of the second ramp is made to vary so as to determine for each value of the second ramp a deviation with respect to the value of the constraint belonging to the said first set and corresponding to the said fixed value of the first ramp; and a third step of calculation in which the values of the constraint are calculated for all the values of the first ramp and of the second ramp, while adding the various deviations obtained to the values of the said first set of values.

Stated otherwise, instead of performing a series of iterations for the set of values of constraints to be determined, the first aspect of the invention provides that the values of the constraints be calculated for a first series of values while the ramp of a signal is made to vary. Next, by the values of the ramp of the second signal for a fixed value of the ramp of the first signal, the deviation separating the constraint value common to the two steps and the values of constraints corresponding to each ramp value of the second signal is calculated. Finally, this deviation is referred to the constraint values of the first series so as to determine the set of constraint values through a simple translation.

Specifically, the inventors have observed that regardless of the values of the ramp of the first signal, the deviation between two values of constraints for two values of ramp of the second signal is constant. This property emerges from several observations. Firstly, from equations, the inventors have arrived at the conclusion that only the input inverters of a sequential cell, that are present in all the sequential cells, from the simplest to the most complex, influence the variation of the value of the constraint. Consequently, by focusing solely on the signals delivered to these two inverters, it is possible to very accurately determine the value of the constraint. It is not therefore necessary to measure the propagation times for each internal logic gate of the sequential cell.

The method according to this first aspect of the invention therefore makes it possible to limit the number of simulations. Furthermore, this method makes it possible to consider the sequential cell to be characterized as a "black box", that is to say it is no longer necessary to consider each of its components.

The first step of determination of the method can comprise a simulation by dichotomy. The method according to the first aspect of the invention is then particularly advantageous. It may especially be applied to any type of sequential cell.

According to a first embodiment, the determination of a deviation can comprise the determination by simulation of a constraint value corresponding to another value of the second ramp, and the difference between the constraint value associated with this other value of the second ramp and the value of the constraint associated with the value of the second ramp fixed in the first step of determination. Stated otherwise, in this second step of determination the same is done as in the first step of simulation, that is to say a set of values of constraints is determined while varying the value of the second ramp, and having fixed the value of the first ramp at one of the values taken in the first step of determination.

According to another mode of implementation, the determination of the deviations comprises the respective measurements of the values of a temporal variable of the cell dependent on the nature of the second signal, which are obtained on the basis of the model of the cell for the respective values of the second ramp. Stated otherwise, by measuring a well-chosen temporal variable, the deviations used to determine the set of values of constraints are obtained directly.

For example, when the second signal is the clock signal, the temporal variable can correspond to the difference between two lags for two values of ramp of the clock signal, each lag corresponding to the time elapsed between the clock edge immediately following the edge of a data item delivered as input, and the edge of the data item generated as output. By contrast, when the second signal is different from the clock signal, the temporal variable can correspond to half the product between a characteristic parameter of the technology and the ramp of the second signal delivered to the second sequential cell. The second signal can belong to a set of signals comprising the enabling signal as well as the signals for setting the sequential cell to zero and to one.

According to a mode of implementation of the invention, for each simulation of the characterization phase, a reference propagation time corresponding to the time elapsed between the clock edge immediately following the edge of a data item delivered as input and the edge of the data item generated as output is measured. Next, an interval the middle of which corresponds to the value of the constraint is determined by dichotomy. The determination of the interval comprises: the determination of the amplitude of the simulation interval; the fixing of the value of the constraint at the midvalue of the amplitude of the simulation interval; a simulation phase in which there is measured the value of the propagation time for the bounds fixed of the simulation interval, and in which some simulation interval is restricted by increasing its lower bound if the propagation time determined is equal to the reference propagation time, or by decreasing its lower bound otherwise; and the reiteration of the simulation phase so long as the interval is less than a given accuracy value. Preferably, the accuracy value is of the order of a few tens of picoseconds.

According to a mode of implementation of the invention, on completion of the characterization phase, the values of constraints calculated during the third step of calculation are re-evaluated by simulation with the aid of a dichotomy procedure, redefining a new value of the simulation interval which is then centered for each simulation on the value of the constraint obtained during the said third step of calculation. The reiteration of the characterization phase has the advantage of optimizing the value of the constraint with few iterations for each simulation, given that a restricted simulation interval centered about a first value of the constraint determined in the course of a first characterization step is chosen at the outset. Preferably, the new amplitude of the simulation interval is of the order of a few tens of picoseconds.

According to another aspect of the invention, there is proposed a system for evaluating a constraint of a sequential cell able to sample an input data item regulated by a clock signal, the constraint being dependent on the ramp of a first signal and on the ramp of a second signal, these two signals being delivered to the sequential cell and comprising the clock signal. The constraint belongs to the group formed by the setup time and the hold time of the data item.

According to a general characteristic of this other aspect of the invention, the system comprises a characterization unit or means comprising: a model of the sequential cell; a memory unit or means able to store values of the first ramp and of the second ramp; a first unit or means of simulation able for a value of the second ramp, fixed at one of the stored values, to determine a first set of values of the constraint by simulation for the stored values of the first ramp with the aid of the model of the sequential cell; a second unit or means of determination able for a value of the first ramp, fixed at one of the stored values, to determine for each stored value of the second ramp a deviation with respect to the value of the constraint belonging to the first set and corresponding to the fixed value of the first ramp; and a unit or means of calculation able to calculate the values of the constraint for all the values stored of the first ramp and of the second ramp, by adding the various deviations obtained to the values of the first set of values. Preferably, the first means of simulation perform a simulation by dichotomy.

According to an embodiment of the invention, the second means of determination of the deviations comprise second means of simulation able, for each deviation, to determine a constraint value corresponding to another value of the second ramp, and to compute the difference between the constraint value associated with this other value of the second ramp and the value of the constraint associated with the fixed value of the second ramp used by the first means of determination, so as to obtain the deviation.

According to another embodiment of the invention, the second means of determination comprise means of measurement of the values of a temporal variable of the cell. This temporal variable is dependent on the nature of the second signal, and these values are obtained on the basis of the model of the cell for the respective stored values of the second ramp. For example, when the second signal is the clock signal, the temporal variable corresponds to the difference, between two lags for two values of ramp of the clock signal, each lag corresponding to the time elapsed between the clock edge immediately following the edge of a data item delivered as input, and the edge of the data item generated as output.

By contrast, when the second signal is different from the clock signal, the temporal variable can correspond to half the product between a characteristic parameter of the technology and the ramp of the second signal delivered to the sequential cell. The second signal may for example belong to a set of signals comprising the enabling signal as well as the signals for setting the sequential cell to zero and to one.

According to an embodiment of the invention, the means of simulation can advantageously comprise means of measurement of a reference propagation time corresponding to the time elapsed between the clock edge immediately following the edge of a data item delivered as input and the edge of the said data item generated as output. The means of simulation are therefore able to determine by dichotomy an interval the middle of which corresponds to the value of the constraint. The simulation means comprise for the determination of the interval: first means of determination of the amplitude of the simulation interval; and second means of fixing of the value of the constraint at the midvalue of the amplitude of the simulation interval, The means of simulation are able to measure the value of the propagation time with the amplitude of the fixed simulation interval, and are able to restrict the simulation interval by increasing its lower bound if the propagation time determined is equal to the reference propagation time, or by decreasing its lower bound otherwise. Furthermore, the simulation means comprise a feedback loop connected between their output and their input comprising means of comparison of the amplitude of the simulation interval with a value of stoppage of the simulation means, corresponding to a given accuracy value. The accuracy value is advantageously of the order of a few tens of picoseconds.

According to an embodiment, the system can comprise means of evaluation able to re-evaluate by simulation with the aid of a dichotomy procedure, the values of constraints calculated by the means of calculation, the means of evaluation comprising means able to redefine a new value of the simulation interval which is then centered for each simulation on the value of the constraint obtained by the means of calculation. The new amplitude of the simulation interval can advantageously be of the order of a few tens of picoseconds.

The invention also proposes a calculation unit, for example a computer, comprising a system for evaluating a constraint of sequential cells as defined above.

BRIEF DESCRIPTION OF THE DRAWINGS

Other advantages and characteristics of the invention will become apparent on examining the detailed description of the methods and nonlimiting embodiments of the invention and the appended drawings, in which.

DETAILED DESCRIPTION OF THE PREFERRED EMBODIMENTS

Figure 1:
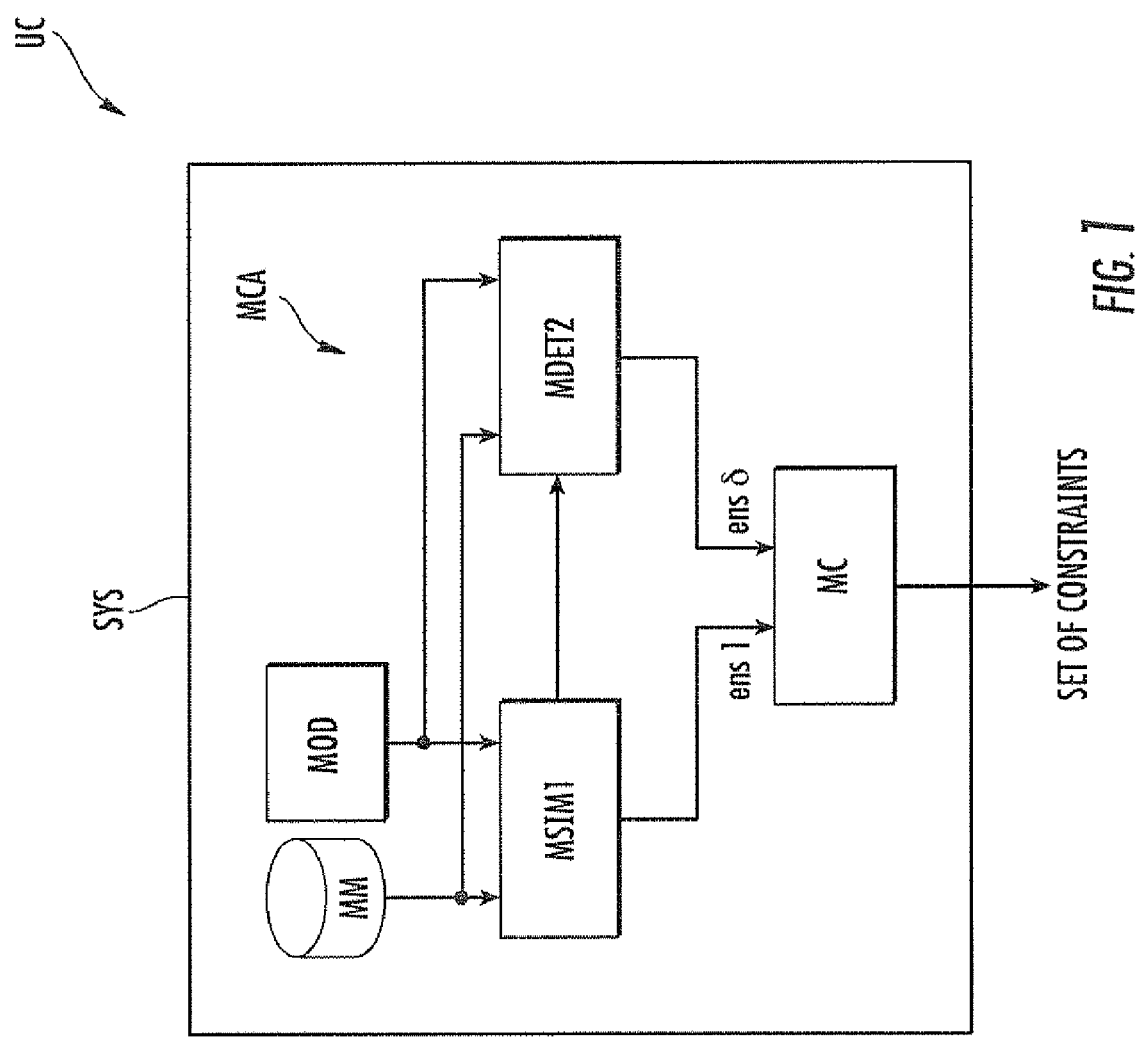
FIG. 1 is a schematic diagram illustrating an embodiment of a system for characterizing a sequential cell according to the invention.

Referring to FIG. 1, the reference UC designates a calculation unit, for example a computer. The calculation unit UC comprises a system SYS for characterizing a sequential memory cell according to an embodiment of the invention. The system SYS comprises a characterizing unit or means MCA able to determine a set of values of constraints as a function of the ramp of a first and of a second input signal of the sequential cell to be characterized.

The characterizing unit or means MCA comprise storage unit or means MM for storing a set of values of the ramp of the first signal and a set of values of the ramp of the second signal. The storage means MM are connected to a first unit or means of simulation MSIM1 and a second means or unit of determination MDET2. The first means of simulation MSIM1 are able to determine a first set of values of constraints ens1 for a value of the second ramp that is fixed and for the set of values of the first ramp that are stored by the storage means MM. This set of values of constraints ens1 is determined by simulation with the aid of a model of the sequential cell MOD, which model is connected with the first means of simulation MSIM1. A mode of implementation of the simulation will be described in greater detail hereinbelow.

The characterizing means MCA also comprise a second unit or means of determination MDET2 connected to the first means of simulation MSIM1. For a fixed value of the first ramp, stored by the storage means MM, the means MDET2 calculate the deviations ensδ separating the value of the constraint belonging to the first set ens1 and taken as the value of the first ramp fixed, and each value of the constraint taken for each stored value of the second ramp. Various modes of implementation of the means MDET2 will be described in greater detail hereinbelow.

Additionally, the characterizing means MCA comprise means or a unit of calculation MC, which receive the first set ens1 of values of constraints determined by the first means of simulation MSIM1 and the set of deviations ensδ determined by the second means of determination MDET2. The means of calculation MC refer the deviations ensδ calculated to the values of constraints of the first set ens1 so as to deduce therefrom the set of values of constraints taken for all the possible combinations and values of the first ramp and of the second ramp.

Figure 2:
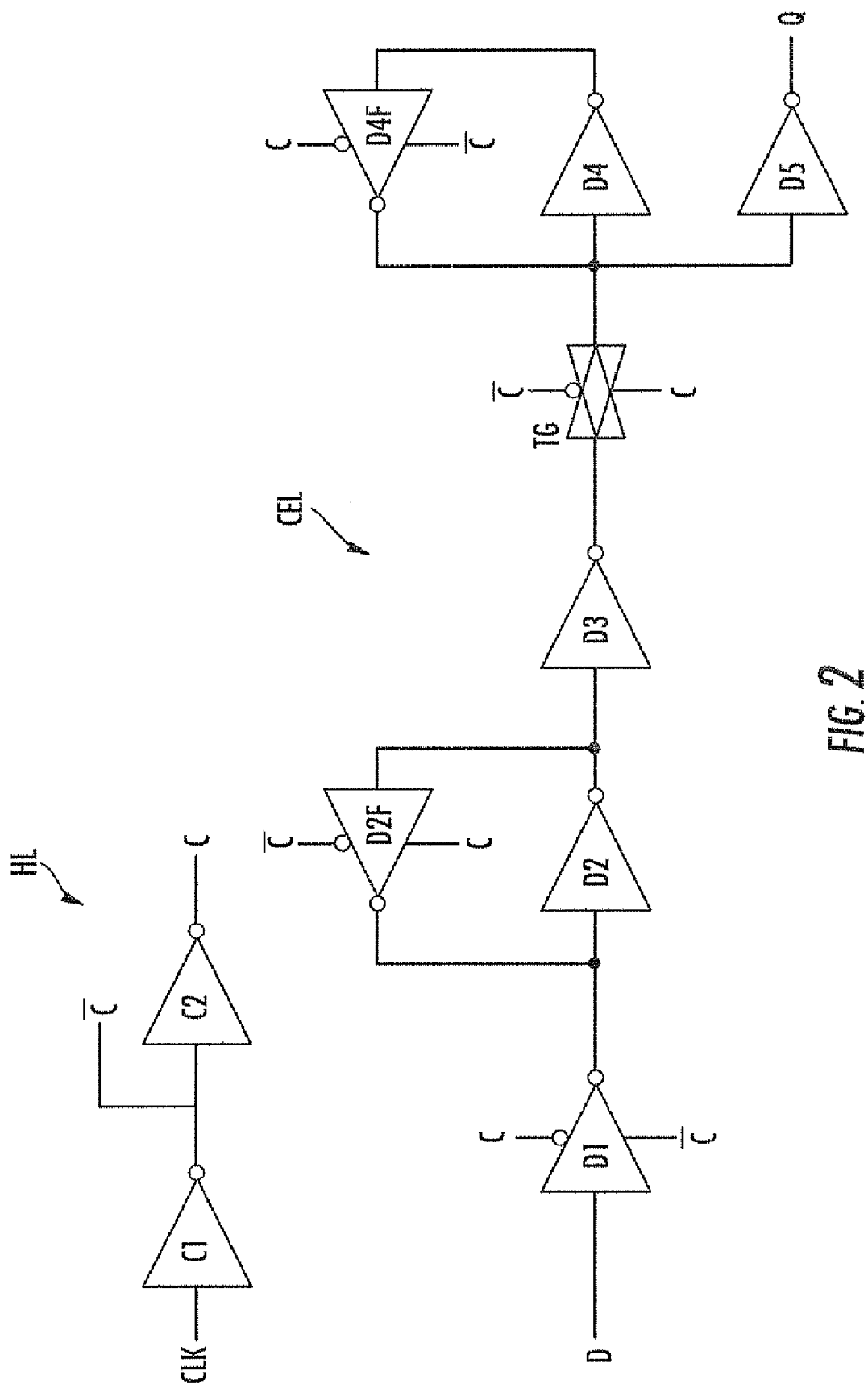
FIG. 2 is a schematic diagram illustrating an exemplary sequential cell to be characterized.

FIG. 2 represents an exemplary sequential cell CEL to be characterized. The cell CEL is here a simple flip-flop receiving input data D and delivering output data Q. Each output value corresponds to the value of the input signal at the active edge of a control signal, here the signal C. The cell CEL comprises a controllable input inverter D1 able to receive input data D. The input inverter D1 is connected to a first latch-circuit formed of two inverters D2 and D2F which is controllable. The first latch-circuit is connected to an inverter D3 itself linked to a controllable transfer transistor TG.

The transfer transistor TG is connected on the one hand to a second latch-circuit formed of two inverters D4 and D4F which is controllable, and on the other hand to an inverter D5 able to deliver the output signal Q. The controllable inverters of the flip-flop CEL are controlled by the control signal C and its complement $\overline{C}$ formulated for example by a clock HL. The clock HL receives a first signal CLK delivered for example by a quartz to a first inverter C1 of the clock HL. The inverter C1 generates as output the signal $\overline{C}$. Furthermore it is connected to a second inverter C2 which delivers as output the control signal C.

Figure 3:
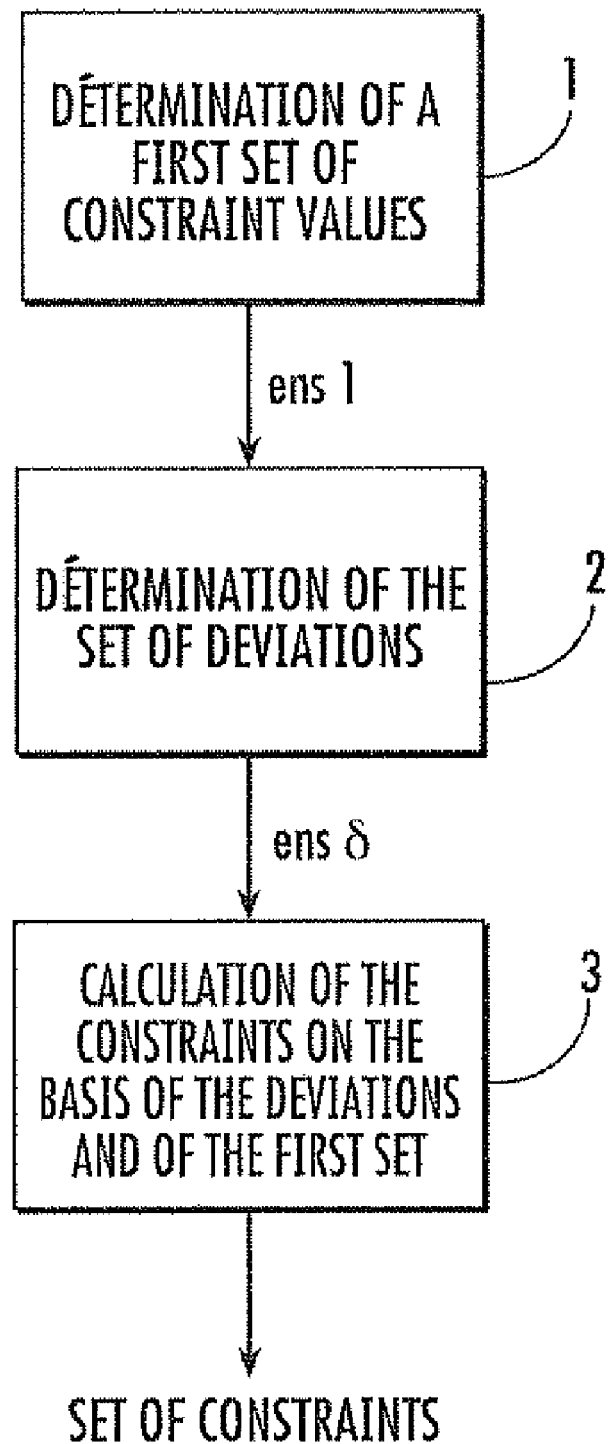
FIG. 3 is a flowchart illustrating a mode of implementation of the invention.

Referring now to FIG. 3, which describes more precisely the manner of operation of the characterizing unit or means MCA. The manner of operation of the means MCA is described for two signals, which here are the clock signal corresponding to the second signal, and the signal of input data of the sequential cell which corresponds to the first signal. Of course, the role of these two signals may be swapped, and the input data signal may be replaced by any other signal delivered as input of the sequential cell, for example the reset to zero signal ("reset"), the reset to one signal ("set") or else the data enabling signal ("enable")

During a first step 1, the first set of values of constraints ens1 is determined at the outset. The first set ens1 is obtained here by fixing the value of the ramp of the second signal, that is to say the clock signal TinC. Next, the ramp of the first signal, that is to say the input data signal TinD, takes successively a series of values for which the value of the constraint is determined according to a procedure which will be described more precisely hereinbelow.

Figure 4:
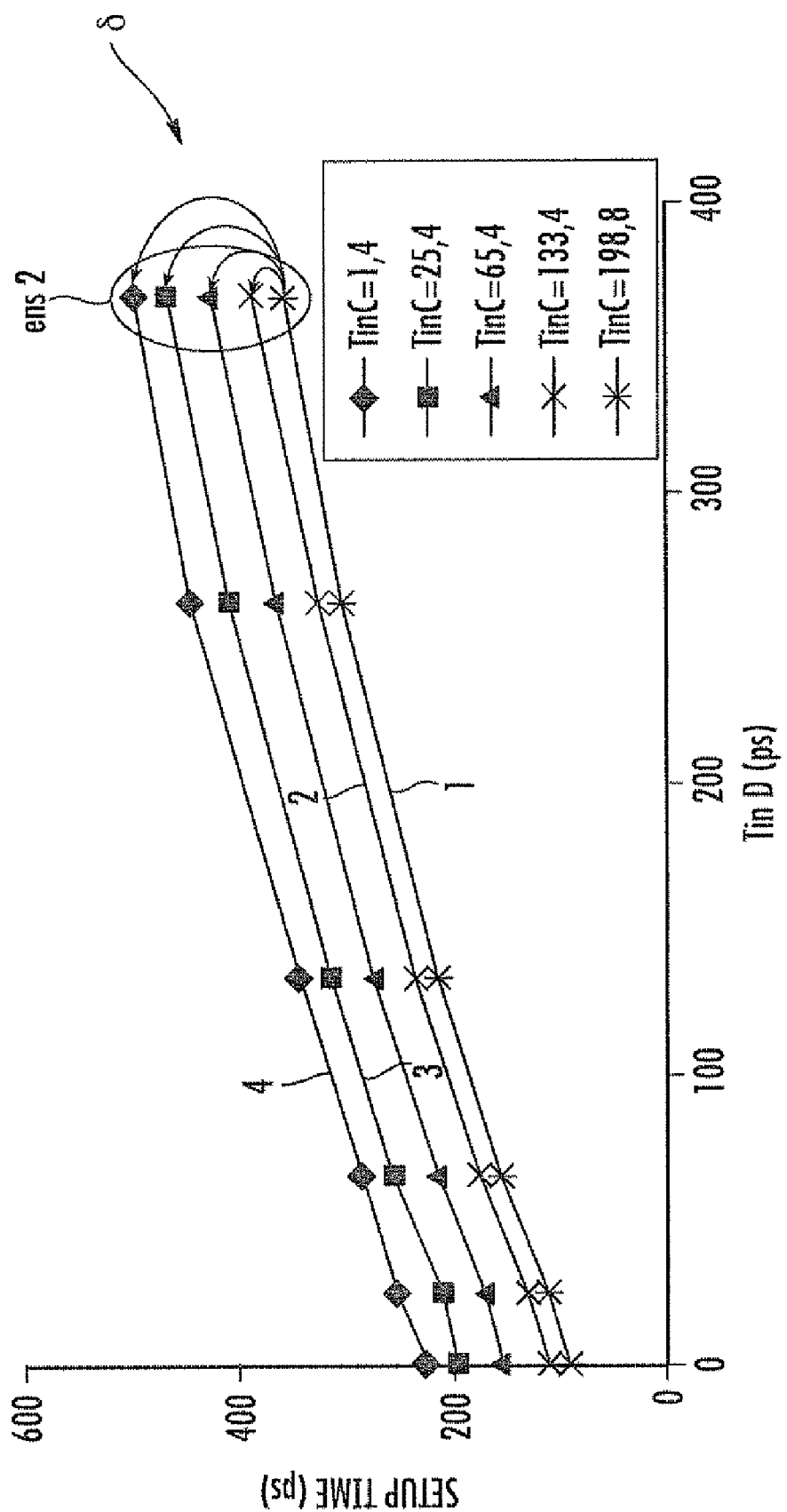
FIGS. 4 and 5 are timing diagrams illustrating two curves of results of the constraint value calculation according to the invention.

For example, as may be seen in FIG. 4, in the case where the constraint to be determined is the data item setup time, the curve referenced 1, which here comprises six values of data ramp (m in the general case), is obtained at the end of the first step of determination. Likewise, in FIG. 5, in the case where the constraint to be determined is the data item hold time, the curve referenced A is obtained for six other values (m in the general case).

We refer again to FIG. 3, where, on completion of the determination of the first set of values of constraints ens1, the set of deviations ensδ which will make it possible to determine the values of constraints for all the possible combinations of values of ramp of the first and of the second signal (m−1)*(n−1) in the general case), n being the number of value taken by the second signal, is determined during a step 2.

Consequently, the procedure for evaluating the constraints according to the invention includes determining by simulation a part of the values of constraints (first row and first column in the table below) in such a way as to be able to deduce therefrom the values of remaining constraints (remaining boxes in the table below), S1 and S2 being the two considered signals delivered to the sequential cell (for example the clock signal the data item signal):

| Table of constraints between | | Ramps of the second signal S2 | | | | |
|---|---|---|---|---|---|---|
| S1 & S2 | | $R2_0$ | $R2_1$ | $R2_2$ | ... $R2_j$ | ... $R2_n$ |
| Ramps of the first signal S1 | $R1_0$ | $Constraint_{0,0}$ | $Constraint_{0,1}$ | $Constraint_{0,2}$ | $Constraint_{0,j}$ | $Constraint_{0,n}$ |
| | $R1_1$ | $Constraint_{1,0}$ | $Constraint_{1,1}$ | $Constraint_{1,2}$ | $Constraint_{1,j}$ | $Constraint_{1,n}$ |
| | $R1_2$ | $Constraint_{2,0}$ | $Constraint_{2,1}$ | $Constraint_{2,2}$ | $Constraint_{2,j}$ | $Constraint_{1,n}$ |
| | ... | | | | | |
| | $R1_i$ | $Constraint_{i,0}$ | $Constraint_{i,1}$ | $Constraint_{i,2}$ | $Constraint_{i,j}$ | $Constraint_{i,n}$ |
| | ... | | | | | |
| | $R1_m$ | $Constraint_{m,0}$ | $Constraint_{m,1}$ | $Constraint_{m,2}$ | $Constraint_{m,j}$ | $Constraint_{m,n}$ |

To do this, several modes of implementation are possible. A first approach includes measuring with the aid of the model of the sequential cell, a temporal variable for each value taken by the second ramp, the value of which corresponds directly to the value of the deviation sought. For example, in the case of the determination of the setup time for the data item, it is sought to measure the propagation time with respect to the clock (commonly called the "C to Q time" by the person skilled in the art) which corresponds to the time elapsed between the clock edge immediately following the edge of a data item delivered as input of the sequential cell, and the edge of the data item generated as output.

Thus, for a fixed value of the ramp of the data item signal, the ramp of the clock signal is made to vary and the difference between two lags for two values of ramp of the clock signal, one of which a reference, is measured, each lag corresponding to the propagation time ("C to Q"), as defined hereinabove. Specifically, the inventors have observed that it was possible to determine the value of the constraint by using the existing deviations between the various propagation times.

The lags are determined by simulation for example, the reference value can be any one of the ramp values of the clock signal. As may be seen in the table below, where the value of the ramp of the reference clock signal is 7 ps:

| Values taken by the ramp of the clock signal | Real and measured values of "setup" ("C to Q") | |
|---|---|---|
| | Δ "setup" real (ps) | Δ "C to Q" (ps) |
| TinC = 7 ps | 0 | 0 |
| TinC = 120 ps | 30 | 27 |
| TinC = 320 ps | 70 | 71 |
| TinC = 670 ps | 130 | 134 |
| TinC = 1000 ps | 225 | 212 |

The propagation time measured with the aid of the model of the sequential cell corresponds to within an error to the data setup time ("set-up").

For this first approach, when the first signal is the clock signal, the inventors have observed that the temporal variable measured is proportional to:

$$V_T \cdot T_{IN}D/2,$$

where:

$V_T$ represents the threshold voltage characteristic of the technology (in volts). In this case, the table obtained for the set of values of the ramp of the clock signal TinC is:

| Values taken by the ramp of the clock signal | Real and measured values of "hold" ("$V_T \cdot T_{IN}D/2$") | |
|---|---|---|
| | Δ "hold" real (ps) | Δ "$V_T \cdot T_{IN}D/2$" (ps) |
| TinC = 7 ps | 0 | 0 |
| TinC = 120 ps | 35 | 29 |
| TinC = 320 ps | 80 | 68 |
| TinC = 670 ps | 120 | 111 |
| TinC = 1000 ps | 140 | 135 |

On completion of these various measurements, it suffices to add the deviation obtained to the reference value (for a ramp value of the clock signal of 7 ps in this example) obtained here by simulation to ascertain the value of the constraint. However, this measurement procedure, although very fast, may be rather inaccurate.

Figure 5:
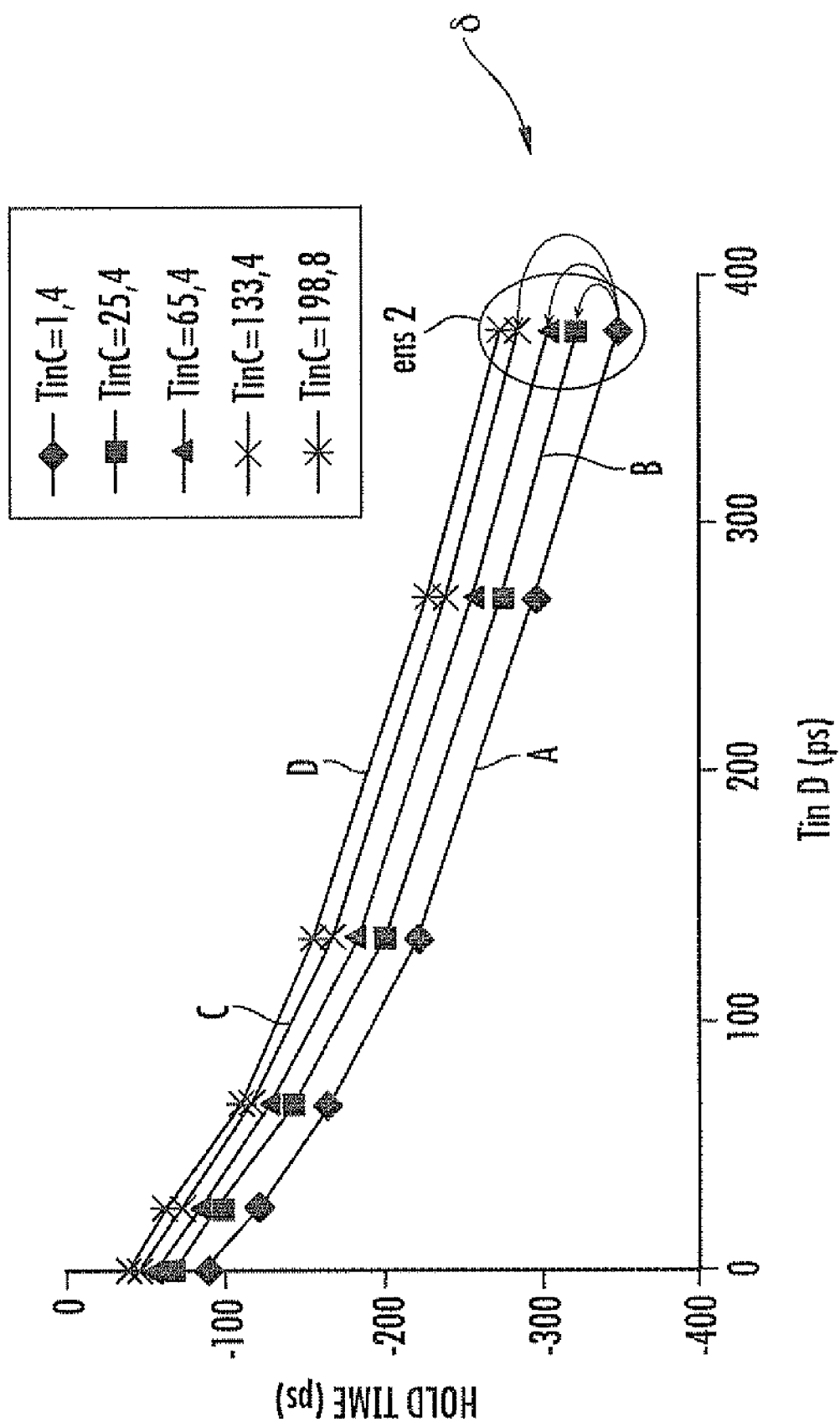
Figure 6:
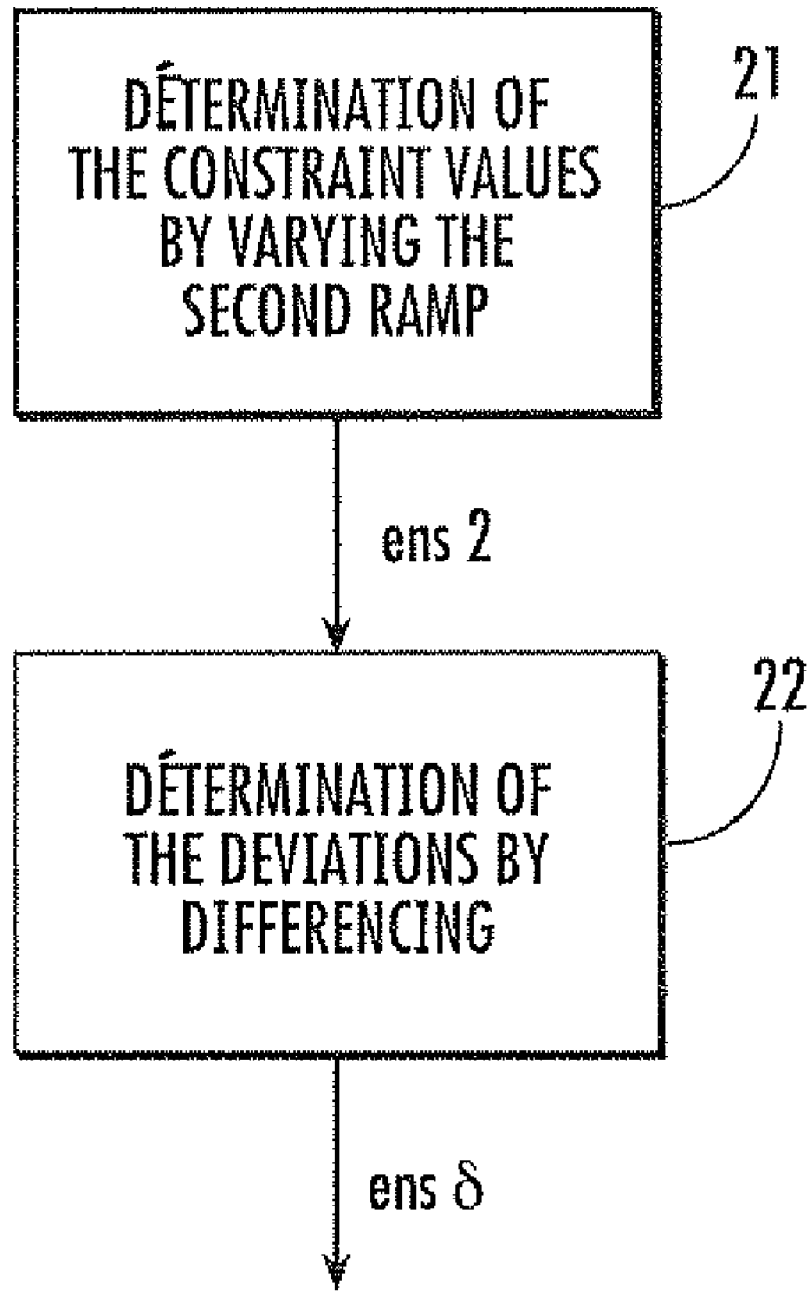
FIG. 6 is a flowchart illustrating in greater detail a step of a method according to a mode of implementation of the invention.

A second approach for determining the set of deviations ensδ is represented in FIG. 6. It includes doing the same as for the first constraint value set. Thus, in a first step 21, a second set of constraint values is determined for a fixed value of the ramp of the input data signal TinD by varying the value of the ramp of the clock signal TinC for a fixed value of the ramp of the data signal TinD. The sets of values referenced ens2 in FIGS. 4 and 5 are thus obtained. On completion of step 21, two curves having a point of intersection are therefore obtained. Thereafter, during a step 22, the deviations are determined by computing the difference between each constraint value of the set ens2 and the value of the constraint common to the two sets ens1 and ens2. One thus obtains a series of deviations δ as may be seen in FIGS. 4 and 5.

Referring again to FIG. 3, where, on completion of step 2, it is possible to calculate the set of constraints for all the possible combinations between the values of the ramps of the clock signal TinC and of the data signal TinD during a step 3. To do this, the deviations δ obtained during the previous step are added to each constraint value of the first set ens1. One thus obtains the other curves 2, 3 and 4 in FIG. 4 and B, C and D in FIG. 5, respectively for the data setup time and hold time. Of course, the role of the various curves respectively 1, 2, 3, 4 and A, B, C and D may be swapped. For example for FIG. 4 it is possible to determine during step 1 the values of constraints of the curve referenced 2 then to calculate the set of deviations ensδ on the basis of one of the values belonging to this curve.

Figure 7:
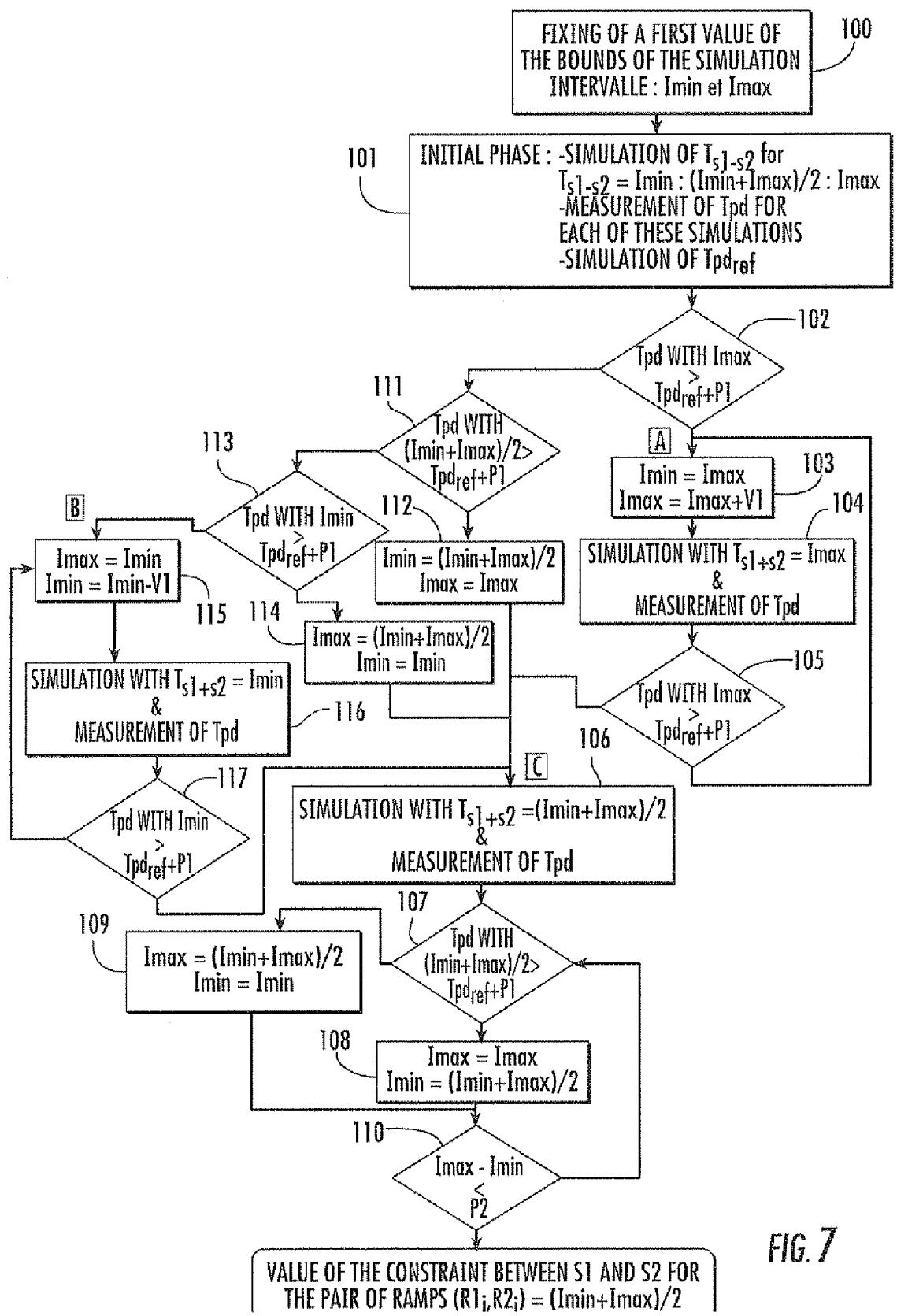
FIG. 7 is a flowchart illustrating in greater detail another step of the method according to a mode of implementation of the invention.
Figure 8:
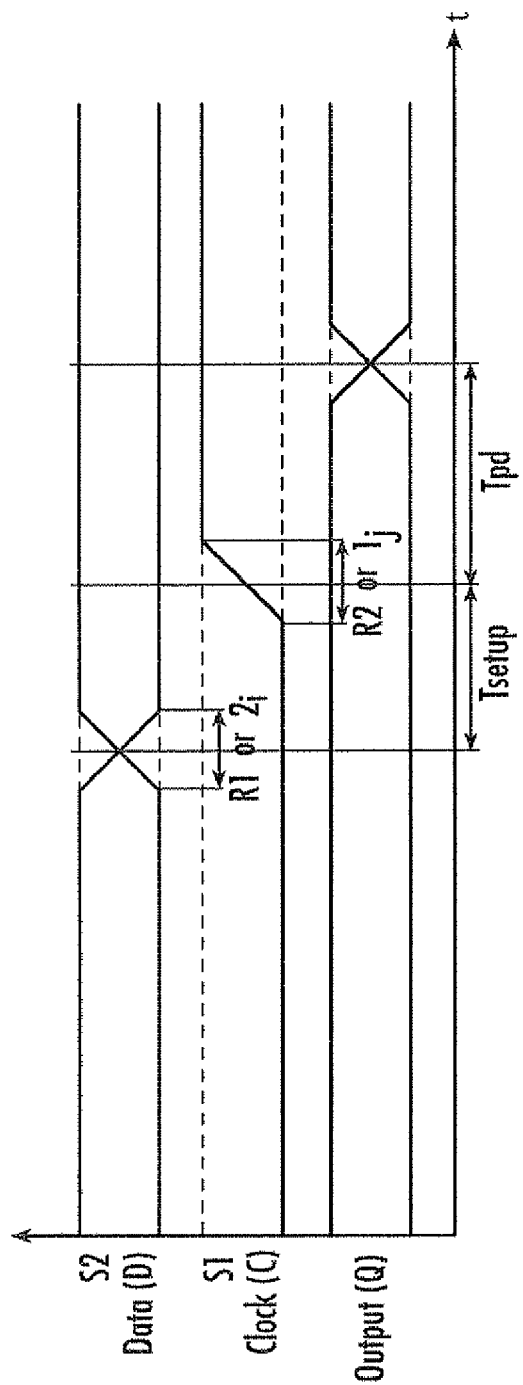
FIGS. 8 and 9 are timing diagrams illustrating the constraints and characteristic temporal values associated with the input and output signals of a sequential cell.
Figure 9:
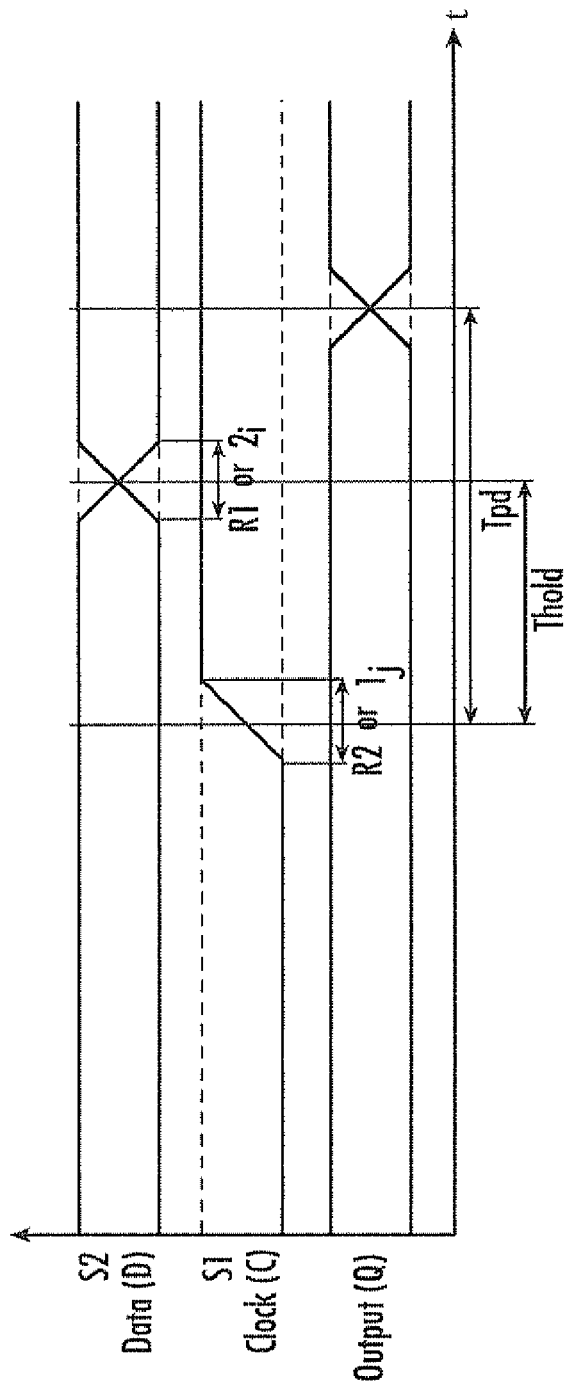

FIG. 7 illustrates more precisely an embodiment of step 1. According to this embodiment, the determination of the first ens1 and of the second set ens2 of constraint values may be performed using in particular a dichotomy procedure, although any other procedure is conceivable. In FIGS. 8 and 9 are represented the setup time $T_{setup}$ and hold time $T_{hold}$ of the data, as defined previously. These constraint times are those of a sequential cell, for example that represented in FIG. 2. This cell receives two input signals S1 and S2 respectively the clock signal (C) and the data signal (D) in this example, and delivers an output signal (Q). For each pair of ramps ($R1_j$; $R2_i$) of the two signals, respectively S1 (m ramp values) and S2 (n ramp values), a constraint value (m*n values) is determined, as illustrated in the table below:

| Table of constraints between S1 & S2 | | Ramps of the second signal S2 | | | | | |
|---|---|---|---|---|---|---|---|
| | | $R2_0$ | $R2_1$ | $R2_2$ | ... $R2_j$ | ... | $R2_n$ |
| Ramps of the first signal S1 | $R1_0$ | $Constraint_{0,0}$ | $Constraint_{0,1}$ | $Constraint_{0,2}$ | $Constraint_{0,j}$ | | $Constraint_{0,n}$ |
| | $R1_1$ | $Constraint_{1,0}$ | $Constraint_{1,1}$ | $Constraint_{1,2}$ | $Constraint_{1,j}$ | | $Constraint_{1,n}$ |
| | $R1_2$ | $Constraint_{2,0}$ | $Constraint_{2,1}$ | $Constraint_{2,2}$ | $Constraint_{2,j}$ | | $Constraint_{2,n}$ |
| | ... | | | | | | |
| | $R1_j$ | $Constraint_{i,0}$ | $Constraint_{i,1}$ | $Constraint_{i,2}$ | $Constraint_{i,j}$ | | $Constraint_{i,n}$ |
| | ... | | | | | | |
| | $R1_m$ | $Constraint_{m,0}$ | $Constraint_{m,1}$ | $Constraint_{m,2}$ | $Constraint_{m,j}$ | | $Constraint_{m,n}$ |

Furthermore, on each of the two FIGS. 8 and 9 is represented the data propagation time (Tpd) as defined previously.

Referring again to FIG. 7. The step of determining the values of constraints represented in this figure is applied both to the determination of the setup time and to the determination of the hold time of the data. The principle of the procedure includes delimiting the simulation interval to which the value of the constraint belongs, then in fixing the value of the constraint to be determined at a given value belonging to this simulation interval.

Next, the value of the constraint is made to vary successively in such a way that the value of the data propagation time for this fixed value of the constraint corresponds to the reference propagation time of the sequential cell, this signifying that the value assigned to the constraint is exact. More precisely, in a first step 100, each of the bounds of the simulation interval, called Imin and Imax respectively, is fixed at a given value. The value of the constraint must belong to this simulation interval, which typically has an amplitude of 1 ns, but which may take any other value. During an initial phase 101, the constraint value $T_{S1-S2}$ is fixed at three different values respectively at Imin, (Imin+Imax)/2 and Imax. Data propagation time Tpd is then measured for each of the fixed values of the data item. Furthermore, during this initial phase 101, the reference data propagation time $Tpd_{ref}$ is determined by simulation.

A first test 102 is then carried out in which the data propagation time Tpd is compared with the value of the constraint fixed at the upper band of the interval Imax with the reference propagation time $Tpd_{ref}$ with a tolerance P1 in the value of the propagation time Tpd, which corresponds for example to 10% of the value of the reference propagation time $Tpd_{ref}$. If the comparison is true, we then revert to case A, that is to say the value of the constraint to be determined is greater than the maximum value of the starting simulation interval.

In this case, we go to step 103 where the previous value of Imax is assigned to the value of the minimum bound of the simulation interval Imin. The new value of Imax is then equal to the old value of Imax to which is added the amplitude of the new interval V1, typically 1ns, that is to say the same amplitude as the starting interval. We then go to step 104 where a new simulation is performed, arbitrarily fixing the value of the constraint to be determined $T_{S1-S2}$ at the maximum bound of the new interval, Imax. The data propagation time Tpd is measured again.

A test 105 is performed again in which just as for the test 102, the new data propagation time is compared with the reference propagation time $Tpd_{ref}$ with the tolerance P1. Steps 103, 104 and 105 are repeated as long as this test 105 is true. If the test 105 is false, we then revert to phase C, that is to say at this instant, the arbitrary value at which the constraint $T_{S1-S2}$ has been fixed actually lies in the simulation interval, Consequently, a new simulation is performed, fixing the value of the constraint to be determined at (Imin+Imax)/2 during a step 106. During this step, the data propagation time is measured again.

A test 107 is then carried out. The data propagation time Tpd measured with the constraint $T_{S1-S2}$ fixed at (Imin+

Imax)/2 is compared with the reference propagation time $Tpd_{ref}$ with the tolerance P1. If the result of the comparison is false, then, the value of the lower bound of the simulation interval is modified 108 such that Imin=(Imin+Imax)/2. Otherwise, we proceed to step 109, that is to say the lower bound of the simulation interval Imin is not modified but the value of the upper bound Imax is replaced by (Imin+Imax)/2.

On completion of step 108 or of step 109, the test 110 is performed, that is to say the amplitude of the simulation interval Imax-Imin is compared with a desired accuracy P2 for the value of the constraint. This accuracy P2 constitutes a stopping test for the dichotomy algorithm comprising these steps 106 to 110. As long as the test 110 is false, steps 106 to 110 are reiterated. When the test 110 becomes true, then the value of the constraint for the pair of ramps ($R1_i$, $R2_j$) is equal to (Imin+Imax)/2.

If the test 102 is false, then another comparison is performed of the data propagation time Tpd measured with a constraint fixed at (Imin+Imax)/2 with the reference propagation time $Tpd_{ref}$ with the tolerance P1. If the test 110 is true, then the value of the lower bound of the simulation interval is modified 112, such that Imin=(Imin+Imax)/2. Then the approach proceeds to the dichotomy algorithm comprising steps 106 to 110 as described hereinabove.

If the result of the test 111 is false, a new test 113 is carried out in which the data propagation time Tpd measured with the constraint fixed at the lower bound of the simulation interval Imin is compared with the reference propagation time $Tpd_{ref}$ with a tolerance P1. If the test 113 is true, then the lower bound Imax of the simulation interval is modified during a step 114, such that Imax=(Imin+Imax)/2. Then the approach reverts to phase C where the dichotomy algorithm comprising steps 106 to 110 as explained hereinabove is executed. If the result of the test 113 is false, then revert to phase B, that is to say the value of the constraint to be determined is lower than the lower bound of the current simulation interval.

In this case, the values of the bounds of the simulation interval 115 are changed. Imax then takes the value Imin of the previous simulation interval, and Imin is equal to the value of the lower bound of the previous simulation interval from which the amplitude V1 defined hereinabove is subtracted. Then a new simulation is performed, having fixed the constraint value $T_{S1-S2}$ at the minimum value Imin of the new simulation interval and the value of the data propagation time Tpd is measured 116.

A new test 117 is then carried out in which the data propagation time Tpd measured with the fixed constraint Imin is compared with the reference propagation time with a tolerance T1. If the comparison is right, revert to phase C and the dichotomy algorithm comprising steps 106 to 110 is executed. Otherwise, as long as the test 117 if false, steps 115 to 117 are reiterated.

To improve the accuracy of the values of constraints determined on the basis of the set of deviations ensδ, it is possible to apply the procedure illustrated by FIG. 7. The simulation interval is then formulated on the basis of the constraint value already calculated, with a small amplitude for example ±20 ps about this value. The number of iterations is limited (for example two or three instead of nine) since a very accurate interval which by dint of its definition contains the constraint value was determined at the start. A much more accurate result is therefore obtained than during the first characterization phase.

The cell model used for the simulations may be of the "BSIM3" type available on the Internet site of the University of Berkeley (United States) or indeed a model of "SPICE" type available from the University of Florida (United States). Additionally, the simulations may be performed by software means of simulation implementing for example simulation software known by the name ELDO and marketed by the company MENTOR GRAPHICS.

The method according to the invention makes it possible to achieve a relatively significant simulation time gain. In 90 nm technology, for a simple sequential cell requiring the determination of four constraint values, the simulation time is decreased by at least 25% relative to existing procedures. This decrease is at least 20% for a more complex cell requiring the determination of 24 constraint values. These decreases represent a saving of several hours of simulation time for the characterization of a sequential memory cell.

That which is claimed is:

1. A method for evaluating a constraint of a sequential memory cell able to sample an input data item regulated by a clock signal, the constraint being dependent on the ramp of a first signal and on the ramp of a second signal, these two signals being delivered to the sequential memory cell and including the clock signal, the constraint being at least one of a setup time and a hold time of the data item, the method comprising a characterization phase comprising:
    a first determination of a first set of values of the constraint including a simulation using a model of the sequential memory cell wherein a value of the second ramp is fixed and a value of the first ramp is varied;
    a second determination, for each value of the second ramp wherein the value of the second ramp is varied, of a deviation with respect to a value of the constraint belonging to the first set of values and corresponding to a fixed value of the first ramp which is fixed at a value from the first determination; and
    a third calculation wherein the values of the constraint are calculated for all values of the first ramp and of the second ramp, by adding the determined deviations to the values of the first set of values.

2. The method according to claim 1, wherein the simulation of the first determination comprises a dichotomy simulation.

3. The method according to claim 1, wherein the second determination comprises the determination by simulation of a constraint value corresponding to another value of the second ramp, and a difference between the constraint value associated with the another value of the second ramp and a value of the constraint associated with the value of the second ramp fixed in the first determination.

4. The method according to claim 1, wherein the second determination comprises respective measurements of a values of a temporal variable of the cell dependent on the second signal, which are obtained based upon the model of the cell for the respective values of the second ramp.

5. The method according to claim 4, wherein when the second signal is the clock signal, the temporal variable corresponds to a difference between two lags for two values of a ramp of the clock signal, each lag corresponding to the time elapsed between a clock edge immediately following an edge of a data item delivered as input, and an edge of the data item generated as output.

6. The method according to claim 4, wherein when the second signal is different from the clock signal, the temporal variable corresponds to half a product between a characteristic technology parameter and a ramp of the second signal delivered to the sequential memory cell.

7. The method according to claim 1, wherein the second signal belongs to a set of signals comprising an enabling signal as well as signals for setting the sequential-memory cell to zero and to one.

8. The method according to claim 1 wherein for each simulation, a reference propagation time corresponding to a time elapsed between a clock edge immediately following an edge of a data item delivered as input and an edge of the data item generated as output is measured, and an interval, a middle of which corresponds to the value of the constraint, is determined by dichotomy, the determination of the interval comprising:
- a determination of an amplitude of a simulation interval;
- a fixing of the value of the constraint at a midvalue of an amplitude of the simulation interval;
- a simulation phase in which there is measured a value of a propagation time with the amplitude of the simulation interval, and in which a simulation interval is restricted by increasing its lower bound if the propagation time determined is equal to a reference propagation time, or by decreasing its lower bound otherwise; and
- a reiteration of the simulation phase so long as the simulation interval is less than a given accuracy value.

9. The method according to claim 8, wherein the accuracy value is of an order of a few tens of picoseconds.

10. The method according to claim 8 wherein on completion of the characterization phase, the values of constraints calculated during the third calculation are re-evaluated by simulation with aid of a dichotomy procedure, redefining a new value of the simulation interval which is then centered for each simulation on the value of the constraint obtained during the third calculation.

11. The method according to claim 8, wherein the new amplitude of the simulation interval is of an order of a few tens of picoseconds.

12. A system for evaluating a constraint of a sequential memory cell able to sample an input data item regulated by a clock signal, the constraint being dependent on a ramp of a first signal and on a ramp of a second signal, the signals being delivered to the sequential memory cell and including the clock signal, the constraint being at least one of a setup time and a hold time of the data item, the system comprises a characterization unit comprising:
- a model of the sequential memory cell;
- a memory unit to store values of the first ramp and of the second ramp;
- a first simulation unit, for a value of the second ramp fixed at one of the stored values, to determine a first set of values of the constraint by simulation for the stored values of the first ramp based upon the model of the sequential memory cell;
- a second determination unit, for a value of the first ramp fixed at one of the stored values, to determine for each stored value of the second ramp a deviation with respect to the value of the constraint of the first set of values and corresponding to the fixed value of the first ramp; and
- a calculation unit to calculate values of the constraint for all values stored of the first ramp and of the second ramp, by adding the determined deviations to the values of the first set of values.

13. The system according to claim 12, wherein the first simulation unit performs a simulation by dichotomy.

14. The system according to claim 12, wherein the second determination unit comprises a second simulation unit, for each deviation, to determine a constraint value corresponding to another value of the second ramp, and to compute a difference between the constraint value associated with the another value of the second ramp and the value of the constraint associated with the fixed value of the second ramp used by the first determination unit, to obtain the deviation.

15. The system according to claim 12, wherein the second determination unit comprises a measurement unit to measure the values of a temporal variable of the sequential memory cell dependent on the second signal, which are obtained based upon the model of the sequential memory cell for the respective stored values of the second ramp.

16. The system according to claim 15, wherein when the second signal is the clock signal, a temporal variable corresponds to a difference, between two lags for two values of a ramp of the clock signal, each lag corresponding to the time elapsed between a clock edge immediately following an edge of a data item delivered as input, and an edge of the data item generated as output.

17. The system according to claim 15, wherein when the second signal is different from the clock signal, the temporal variable corresponds to half a product between a characteristic technology parameter and the ramp of the second signal delivered to the sequential memory cell.

18. The system according to claim 12 wherein the second signal belongs to a set of signals comprising an enabling signal and signals for setting the sequential memory cell to zero and to one.

19. The system according to claim 12, wherein the first simulation unit comprises a measurement unit to measure a reference propagation time corresponding to a time elapsed between a clock edge immediately following an edge of a data item delivered as input and an edge of the data item generated as output, and the first simulation unit determines by dichotomy, an interval, a middle of which corresponds to the value of the constraint; the first simulation unit comprising a first interval determination unit to determine an amplitude of the interval, and a second fixing unit to fix the value of the constraint at a midvalue of the amplitude of the interval; the first simulation unit measuring the value of a propagation time with the amplitude of the fixed simulation interval, and to restrict the simulation interval by increasing a lower bound if the propagation time determined is equal to the reference propagation time, and by decreasing a lower bound otherwise; and the first simulation unit comprising a feedback loop connected between an output and an input including a comparator to compare the amplitude of the simulation interval with a value of stoppage of the first simulation unit, corresponding to a given accuracy value.

20. The system according to claim 19, wherein the accuracy value is of the order of a few tens of picoseconds.

21. The system according to claim 19, further comprising an evaluation unit to re-evaluate by simulation based upon a dichotomy procedure, the values of constraints calculated by the calculation unit, the evaluation unit redefining a new value of the simulation interval which is then centered for each simulation on the value of the constraint obtained by the calculation unit.

22. The system according to claim 21, wherein the new value of the simulation interval is of the order of a few tens of picoseconds.

* * * * *

UNITED STATES PATENT AND TRADEMARK OFFICE
CERTIFICATE OF CORRECTION

PATENT NO. : 7,487,482 B2
APPLICATION NO. : 11/382602
DATED : February 3, 2009
INVENTOR(S) : Lasbouygues et al.

Page 1 of 2

It is certified that error appears in the above-identified patent and that said Letters Patent is hereby corrected as shown below:

| | |
|---|---|
| Cover Page, item 75, Inventors | Delete: "Joël Schindler, Grenoble (FR)"<br>Insert: -- Joël Schindler, Saint-Egreve (FR) -- |
| Column 6, Line 8 | Delete: "MSIN1"<br>Insert: -- MSIM1 -- |
| Column 7, Line 24 | Delete: "(m-1)"<br>Insert: -- ((m-1) -- |
| Column 7, Table | Delete: Table in Column 7<br>Insert: New Table in Column 7 |

--

| Table of constraints between S1 & S2 | | Ramps of the second signal S2 | | | | |
|---|---|---|---|---|---|---|
| | | $R2_0$ | $R2_1$ | $R2_2$ | ... $R2_j$ | ... $R2_n$ |
| Ramps of the first signal S1 | $R1_0$ | $Constraint_{0,0}$ | $Constraint_{0,1}$ | $Constraint_{0,2}$ | $Constraint_{0,j}$ | $Constraint_{0,n}$ |
| | $R1_1$ | $Constraint_{1,0}$ | $Constraint_{1,1}$ | $Constraint_{1,2}$ | $Constraint_{1,j}$ | $Constraint_{1,n}$ |
| | $R1_2$ | $Constraint_{2,0}$ | $Constraint_{2,1}$ | $Constraint_{2,2}$ | $Constraint_{2,j}$ | $Constraint_{2,n}$ |
| | ... | | | | | |
| | $R1_i$ | $Constraint_{i,0}$ | $Constraint_{i,1}$ | $Constraint_{i,2}$ | $Constraint_{i,j}$ | $Constraint_{i,n}$ |
| | ... | | | | | |
| | $R1_m$ | $Constraint_{m,0}$ | $Constraint_{m,1}$ | $Constraint_{m,2}$ | $Constraint_{m,j}$ | $Constraint_{m,n}$ |

--

Column 9, Table     Delete: Table in Column 9
                    Insert: New Table in Column 9

--

| Table of constraints between S1 & S2 | | Ramps of the second signal S2 | | | | |
|---|---|---|---|---|---|---|
| | | $R2_0$ | $R2_1$ | $R2_2$ | ... $R2_j$ | ... $R2_n$ |
| Ramps of the first signal S1 | $R1_0$ | $Constraint_{0,0}$ | $Constraint_{0,1}$ | $Constraint_{0,2}$ | $Constraint_{0,j}$ | $Constraint_{0,n}$ |
| | $R1_1$ | $Constraint_{1,0}$ | $Constraint_{1,1}$ | $Constraint_{1,2}$ | $Constraint_{1,j}$ | $Constraint_{1,n}$ |
| | $R1_2$ | $Constraint_{2,0}$ | $Constraint_{2,1}$ | $Constraint_{2,2}$ | $Constraint_{2,j}$ | $Constraint_{2,n}$ |
| | ... | | | | | |
| | $R1_i$ | $Constraint_{i,0}$ | $Constraint_{i,1}$ | $Constraint_{i,2}$ | $Constraint_{i,j}$ | $Constraint_{i,n}$ |
| | ... | | | | | |
| | $R1_m$ | $Constraint_{m,0}$ | $Constraint_{m,1}$ | $Constraint_{m,2}$ | $Constraint_{m,j}$ | $Constraint_{m,n}$ |

--

CERTIFICATE OF CORRECTION (continued)
U.S. Pat. No. 7,487,482 B2

| | |
|---|---|
| Column 10, Line 33 | Delete: "ins" <br> Insert: -- 1ns -- |
| Column 11, Line 51 | Delete: "if false" <br> Insert: -- is false -- |
| Column 12, Claim 4 Line 48 | Delete: "of a" <br> Insert: -- of -- |

Signed and Sealed this

Thirteenth Day of April, 2010

David J. Kappos
*Director of the United States Patent and Trademark Office*